United States Patent
Furusawa

(10) Patent No.: US 10,619,247 B2
(45) Date of Patent: Apr. 14, 2020

(54) SUBSTRATE PROCESSING APPARATUS, INJECTOR, AND SUBSTRATE PROCESSING METHOD

(71) Applicant: TOKYO ELECTRON LIMITED, Tokyo (JP)

(72) Inventor: Yoshikazu Furusawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 154 days.

(21) Appl. No.: 15/815,427

(22) Filed: Nov. 16, 2017

(65) Prior Publication Data

US 2018/0142357 A1    May 24, 2018

(30) Foreign Application Priority Data

Nov. 21, 2016 (JP) ................. 2016-226355

(51) Int. Cl.
| | | |
|---|---|---|
| *B01D 45/00* | (2006.01) | |
| *C23C 16/54* | (2006.01) | |
| *C23C 16/455* | (2006.01) | |
| *C23C 16/458* | (2006.01) | |
| *C23C 16/44* | (2006.01) | |
| *H01L 21/67* | (2006.01) | |
| *H01L 21/02* | (2006.01) | |

(52) U.S. Cl.
CPC .......... *C23C 16/54* (2013.01); *C23C 16/4408* (2013.01); *C23C 16/4412* (2013.01); *C23C 16/4583* (2013.01); *C23C 16/45534* (2013.01); *C23C 16/45546* (2013.01); *C23C 16/45561* (2013.01); *C23C 16/45578* (2013.01); *H01L 21/02104* (2013.01); *H01L 21/67017* (2013.01)

(58) Field of Classification Search
CPC ............. C23C 16/54; C23C 16/45534; C23C 16/4583; C23C 16/45578; C23C 16/45561; C23C 16/45546; C23C 16/4412; C23C 16/4408; H01L 21/67017; H01L 21/02104

See application file for complete search history.

(56) References Cited

U.S. PATENT DOCUMENTS

2005/0005851 A1*  1/2005  Keshner ............ C23C 16/4412
                                                   118/723 E
2010/0009079 A1*  1/2010  Yamazaki ............ C23C 16/405
                                                   427/255.28

FOREIGN PATENT DOCUMENTS

| JP | 2009-295729 A | 12/2009 |
|---|---|---|
| TW | 201604312 A | 2/2016 |

* cited by examiner

*Primary Examiner* — Dung H Bui
(74) *Attorney, Agent, or Firm* — Nath, Goldberg & Meyer; Jerald L. Meyer

(57) ABSTRACT

There is provided a substrate processing apparatus, including: a process vessel configured to accommodate a plurality of substrates; a gas supply part configured to supply a gas into the process vessel; an exhaust part configured to exhaust the gas in the process vessel; and a scavenging part configured to scavenge an interior of the gas supply part, wherein the gas supply part is connected to the scavenging part.

6 Claims, 6 Drawing Sheets

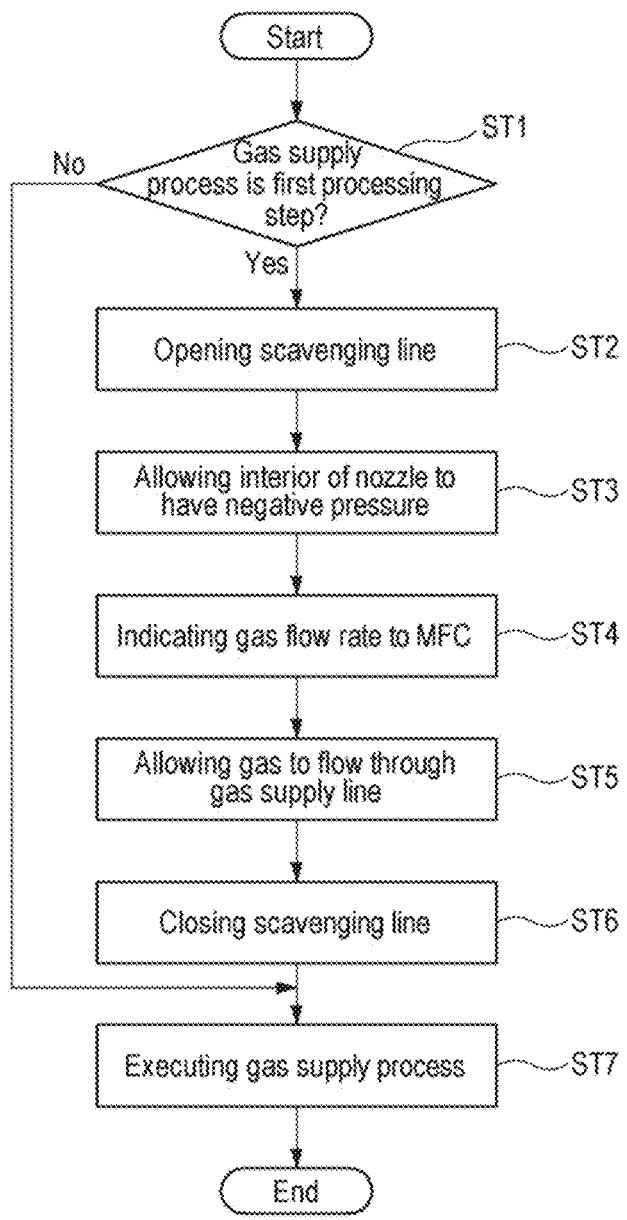

SUBSTRATE PROCESSING APPARATUS, INJECTOR, AND SUBSTRATE PROCESSING METHOD

CROSS-REFERENCE TO RELATED APPLICATION

This application is based upon and claims the benefit of priority from Japanese Patent Application No. 2016-226355, filed on Nov. 21, 2016, the entire contents of which are incorporated herein by reference.

TECHNICAL FIELD

The present disclosure relates to a substrate processing apparatus, an injector, and a substrate processing method.

BACKGROUND ART

In a substrate processing apparatus that performs a film forming process on a substrate by a process such as atomic layer deposition (ALD) or the like, in order to instantaneously supply a reaction gas into a reaction vessel, a gas to be supplied is stored in advance in a buffer tank or the like and supplied into the reaction vessel by an injector such as a gas nozzle or the like while adjusting a flow rate with a mass flow controller (MFC) or the like.

For example, there is known a substrate processing apparatus which includes a reaction tube configured to accommodate and process a plurality of substrates, a gas nozzle for supplying a gas into the reaction tube, and an MFC for controlling a flow rate of a gas to be supplied, and performs a film forming process on the substrate by an ALD method.

In the conventional substrate processing apparatus, however, it takes a time to stabilize the flow rate and thus there may be a case where a sudden gas introduction occurs during that time. When the sudden gas introduction occurs before the gas flow rate becomes stable, there is a problem that quartz pieces cracked in the gas nozzle due to a byproduct adhered to the gas nozzle, delamination of a film formed in the gas nozzle and stress of the delaminated film, or the like are brought as particles (speck, dust or the like) into the reaction vessel, and these particles adhere to the substrate.

Furthermore, in order to prevent such particles from being brought into the reaction tube, conventionally, an operation of disassembling and cleaning a gas supply line including the injector of the substrate processing apparatus and reassembling the gas supply line is performed, but maintenance work is troublesome. In addition, although it is possible that a reaction gas is introduced into the gas nozzle to solidify a particle source (form a film) and thereby prevent the generation of particles, the gas holes of the gas nozzle or the like are blocked, making it impossible to perform the original gas supply.

SUMMARY

The present disclosure provides some embodiments of a substrate processing apparatus capable of suppressing particles from being brought into a process vessel even when a sudden gas introduction occurs.

According to one embodiment of the present disclosure, there is provided a substrate processing apparatus, including: a process vessel configured to accommodate a plurality of substrates; a gas supply part configured to supply a gas into the process vessel; an exhaust part configured to exhaust the gas in the process vessel; and a scavenging part configured to scavenge an interior of the gas supply part, wherein the gas supply part is connected to the scavenging part.

According to one embodiment of the present disclosure, there is provided a injector for supplying a gas into a process vessel configured to accommodate a plurality of substrates, including: an introduction port configured to introduce the gas into the injector; a supply port configured to supply the gas into the process vessel; and a discharge port configured to communicate with an exhaust line configured to scavenge the interior of the injector.

According to one embodiment of the present disclosure, there is provided a substrate processing method which includes supplying a gas from an injector into a process vessel configured to accommodate a plurality of substrates, including: scavenging an interior of the injector before the supplying a gas, wherein in the scavenging an interior of the injector, an internal pressure of the injector is controlled to have a negative pressure.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a flowchart illustrating an example of a substrate processing method according to the embodiment.

DETAILED DESCRIPTION

Figure 1:
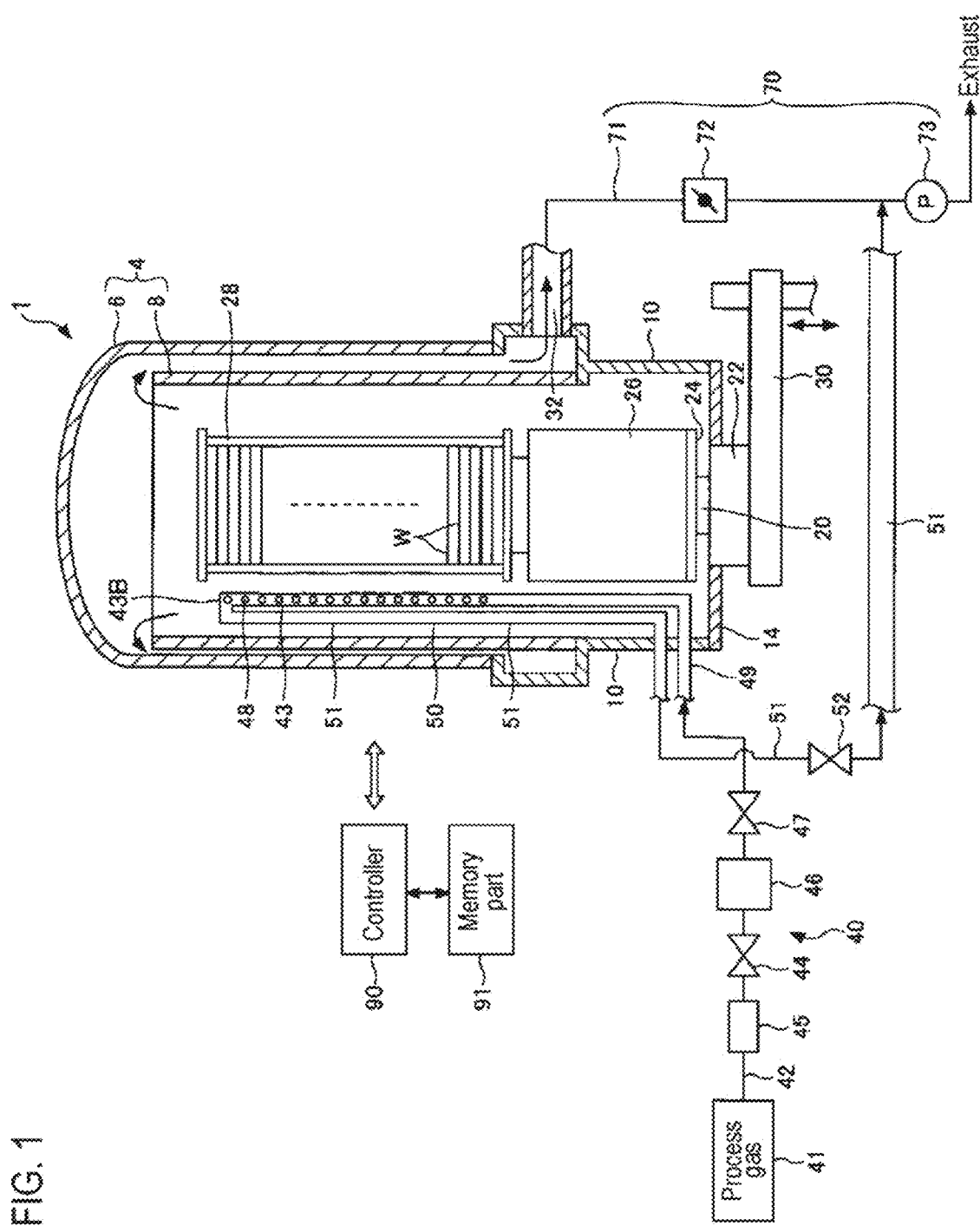
FIG. 1 is a schematic diagram of a substrate processing apparatus according to an embodiment of the present disclosure.

Reference will now be made in detail to various embodiments, examples of which are illustrated in the accompanying drawings. In the present specification and the drawings, common components will be denoted by the same reference numerals and a description thereof will be omitted in some cases. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a schematic diagram of a film forming apparatus 1 which is an example of a substrate processing apparatus according to an embodiment of the present disclosure. As illustrated in FIG. 1, the film forming apparatus 1 includes a reaction vessel 4, a gas supply line 40, and an exhaust line 70. The film forming apparatus 1 further includes a heater (not shown) for heating a wafer W.

The reaction vessel 4 accommodates a semiconductor wafer (hereinafter, referred to as a "wafer W") as a substrate.

The reaction vessel 4 has a substantially cylindrical shape whose longitudinal direction is a vertical direction, and has a double tube structure which includes an outer tube 6 having a ceiling and an inner tube 8 of a cylindrical body concentrically arranged inside the outer tube 6. The outer tube 6 and the inner tube 8 are made of a heat resistant material such as quartz or the like. Furthermore, the reaction vessel 4 is an example of a process vessel constituting a part of the substrate processing apparatus according to the present disclosure.

Lower end portions of the outer tube 6 and the inner tube 8 are supported by a manifold 10 made of stainless steel or the like. The manifold 10 may be formed as a separate member from the outer tube 6 and the inner tube 8, or may be integrally formed with the outer tube 6 and the inner tube 8.

For example, in FIG. 1, the manifold 10 is formed as a portion of the reaction vessel 4 so as to form a substantially cylindrical inner space together with the outer tube 6 and the inner tube 8. In this case, the reaction vessel 4 includes the outer tube 6 and the inner tube 8 which are made of a heat resistant material such as quartz and the manifold 10 made of stainless steel or the like. The manifold 10 is installed in a lower portion of a side surface of the reaction vessel 4 so as to support the outer tube 6 and the inner tube 8 from lower sides of the outer tube 6 and the inner tube 6.

Mid member 14 configured to hermetically close an opening side of a lower end of the reaction vessel 4 is installed in a lower end portion of the manifold 10. The lid member 14 is made of stainless steel or the like and is formed in a disc shape, and is installed so as to be hermetically sealed through a seal met b (not shown) such as an O-ring.

In addition, a rotatable rotary shaft 20 is inserted in a substantially central portion of the lid member 14 while penetrating the substantially central portion of the lid member 14 and maintaining an airtight state by a magnetic fluid seal (not shown) or the like. A lower end of the rotary shaft 20 is connected to a rotary mechanism 22, and a table 24 made of, e.g., stainless steel is fixed to an upper end of the rotary shaft 20.

A heat insulating tube 26 made of a heat resistant material such as quartz or the like is installed on the table 24. Furthermore, a wafer boat 28 as a holder made of a heat resistant material such as quartz or the like is loaded on the heat insulating tube 26.

The wafer boat 28 is a substrate holder which supports a plurality of wafers W at predetermined intervals and is accommodated in the reaction vessel 4. In the wafer boat 28, the substrates such as a plurality of wafers W (e.g., 50 to 175 wafers) or the like are accommodated at predetermined intervals, for example, at a pitch of about 10 mm. The wafer boat 28, the heat insulating tube 26, the table 24, and the lid member 14 are integrally carried (loaded) into the reaction vessel 4 and are integrally unloaded from the reaction vessel 4 by an elevating mechanism 30 serving as, for example, a boat elevator.

Furthermore, the gas supply line 40 supplies a predetermined gas (for example, a process gas such as a silicon-containing gas or the like) into the reaction vessel 4. The gas supply line 40 includes a gas supply source 41 as a supply source of the process gas, a gas pipe 42, and a gas nozzle 43. Also, the gas supply line 40 is an example of a gas supply part constituting a part of the substrate processing apparatus according to the present disclosure. The gas nozzle 43 is an example of an injector constituting a part of the gas supply part.

The gas pipe 42 is a pipe which connects the gas supply source 41 and the gas nozzle 43 and guides the process gas from the gas supply source 41 to the gas nozzle 43. An opening/closing valve 44, a flow rate controller 45 such as a mass flow controller (MFC), a reservoir (buffer tank) 46, and an opening/closing valve 47 are installed in the gas pipe 42.

For example, the process gas may be stored (charged) in the reservoir 46 by opening the opening/closing valve 44 while the opening/closing valve 47 is closed and allowing the process gas to flow at a predetermined flow rate from the gas supply source 41. After the process gas is stored in the reservoir 46, it is possible to supply a predetermined amount of the process gas into the reaction vessel 4 through the gas nozzle 43 by closing the opening/closing valve 44 and opening the opening/closing valve 47. Thus, the start/stop of supply and the flow rate of the process gas are controlled.

The gas nozzle 43 is a nozzle which is connected to the gas pipe 42., penetrates a sidewall of the manifold 10 inward and then is bent upward to be vertically extended, and is formed by, for example, a quartz tube. A plurality of gas discharge holes 48 are formed in a vertical portion of the gas nozzle 43 at predetermined intervals along a longitudinal direction of the gas nozzle 43, and the process gas may be discharged substantially uniformly from the respective gas discharge holes 48 toward the interior of the reaction vessel 4 in a horizontal direction. That is, it is possible to supply the process gas in a direction parallel to the surface of the wafer W. The number of gas nozzles 43 is not limited to one. Two or more gas nozzles 43 may be installed.

In addition, another gas supply line (not shown) for supplying a process gas (e.g., a nitrogen-containing gas) different from the process gas supplied through the gas supply line 40 may be installed. Also in this case, similar to the configuration of the gas supply line 40, another gas supply line may be configured to include a gas supply source, a gas pipe, and a gas nozzle (not shown).

Also in another gas supply line, the gas nozzle is a nozzle which is connected to the gas pipe, penetrates the sidewall of the manifold 10 inward and then is bent upward to be vertically extended, and may be formed by, for example, a quartz tube. It may be configured such that a plurality of gas discharge holes are formed in a vertical portion of another gas nozzle at predetermined intervals along a longitudinal direction of another gas nozzle, and another process gas is discharged substantially uniformly from the respective gas discharge holes toward the reaction vessel 4 in a horizontal direction so that, for example, the nitrogen-containing gas can be supplied in a direction parallel to the surface of the wafer W. Also in another gas supply line, the number of gas nozzles is not limited to one. Two or more gas nozzles may be installed.

The gas nozzle 43 of the gas supply line 40 may also serve as the gas nozzle constituting another gas supply line. In this case, it may be configured such that an opening/closing valve, a flow rate controller such as a mass flow controller (MFC), a reservoir (buffer tank), and an opening/closing valve (not shown) are installed in the gas pipe, and a downstream side of the opening/closing valve installed in a downstream side of the reservoir joins a downstream side of the opening/closing valve 47 of the gas supply line 40. Thus, the start/stop of supply and the flow rate of the gas are also controlled in another gas supply line.

Although not illustrated, a purge gas supply line for supplying a purge gas to the reaction vessel 4 may be installed. The purge gas supply line may be configured to include a purge gas supply source, a purge gas pipe, and a purge gas nozzle.

The purge gas pipe is a pipe which connects the purge gas supply source and the purge gas nozzle and guides the purge gas from the purge gas supply source to the purge gas nozzle. A flow rate controller for controlling a flow rate of the purge gas and an opening/closing valve are installed in the purge gas pipe to control the start/stop of supply and the flow rate of the purge gas. The purge gas nozzle is a straight-shaped (straight pipe-shaped) nozzle which is connected to the purge gas pipe and penetrates the sidewall of the manifold 10 inward, and may be formed by, for example, a quartz tube.

The exhaust line 70 exhausts the gas in the reaction vessel 4. The exhaust line 70 is connected to a gas outlet 32 installed above the manifold 10. The exhaust line 70 includes an exhaust passage 71 connected to the gas outlet 32, and a pressure regulating valve 72 and a vacuum pump 73 which are sequentially connected to the middle of the exhaust passage 71. In this example, in the pressure regulating valve 72, a manometer and an opening/closing valve are integrally configured, but the manometer and the opening/closing valve may be configured separately. With this exhaust line 70, it is possible to exhaust while regulating a pressure of the internal atmosphere of the reaction vessel 4. Also, the exhaust line 70 is an example of an exhaust part constituting a part of the substrate processing apparatus of the present disclosure.

A heater device (not shown) for heating the water W is installed as a heater on an outer peripheral side of the reaction vessel 4 so as to surround the reaction vessel 4. The heater device has a cylindrical heat insulating layer with a ceiling surface. The heat insulating layer may be formed by, for example, a mixture of amorphous silica which has low thermal conductivity and is soft and alumina. The heat insulating layer may be arranged such that its inner periphery is spaced apart from an outer surface of the reaction vessel 4 by a predetermined distance.

In addition, a protective cover (not shown) made of stainless steel or the like may be installed on an outer periphery of the heat insulating layer so as to cover the entire outer periphery of the heat insulating layer. Furthermore, a heater element (not shown) is arranged on an inner peripheral side of the heat insulating layer while winding in a spiral shape. The heater element may be wound around the entire side surface in an axial direction on the inner peripheral side of the heat insulating layer.

The heater element may be divided in the axial direction into a plurality of zones (for example, four zones). Based on a temperature detected by a thermocouple (not shown) installed in the heat insulating layer for each zone, it may be configured to independently control the temperature for each zone.

The control of each component of the film forming apparatus 1 is performed by a controller 90 such as a computer or the like. For example, the controller 90 controls the supply/supply stop of the process gas by the opening/closing operations of the opening/closing valves 44 and 47 in the gas supply line 40 and the flow rate of the gas by the flow rate controller 45, the internal pressure of the reaction vessel 4 by the pressure regulating valve 72 and the vacuum pump 73 in the exhaust line 70, and the temperature of the heater device.

A memory part 91, in which a control program for realizing various processes executed in the film forming apparatus 1 under the control of the controller 90 and various programs recipes) for causing each component of the film forming apparatus 1 to execute the processes according to the processing conditions are stored, is connected to the controller 90. The program includes a program for causing the film forming apparatus 1 to execute a film forming method which will be described later. In addition, various programs may be stored in a storage medium and stored in the memory part 91. The storage medium may be a hard disk or a semiconductor memory, or may be a portable one such as a CD-ROM, a DVD, a flash memory, or the like. Furthermore, the recipe may be appropriately transmitted from another apparatus to the memory part 91 via, for example, a dedicated line.

In the present embodiment, as illustrated in FIG. 1, a scavenging line 50 is connected to the gas supply line 40. The scavenging line 50 is an example of a scavenging part for scavenging the interior of the gas supply line 40. The scavenging line 50 is connected to the gas nozzle 43 of the gas supply line 40. A gas pipe 51 and an opening/closing valve 52 are installed in the scavenging line 50. In addition, a vacuum pump may be installed in the scavenging line 50.

The gas pipe 51 is connected to the gas supply line 40 such that a scavenging gas after scavenging the interior of the gas supply line 40 can pass through the gas pipe 51. The opening/closing valve 52 is installed in the middle of the gas pipe 51, and can control the internal pressure of the gas nozzle 43 of the gas supply line 40 connected to the scavenging line 50 in conjunction with the vacuum pump.

The vacuum pump 73 of the exhaust line 70 may also serve as the vacuum pump that operates in conjunction with the opening/closing valve 52 of the scavenging line 50. In this case, the scavenging line 50 is connected to the exhaust line 70. Specifically, the gas pipe 51 of the scavenging line 50 is connected between the pressure regulating valve 72 and the vacuum pump 73 of the exhaust line 70. With this configuration, since the exhaust line and the scavenging line can be controlled by one vacuum pump, even when the scavenging line is installed, an existing vacuum pump can be used, thus preventing the complexity of the apparatus.

FIGS. 2 to 7 are views illustrating configuration examples (first embodiment to sixth embodiment) of the gas nozzle 43 constituting a part of the gas supply line 40 of the present embodiment, respectively.

Figure 2:
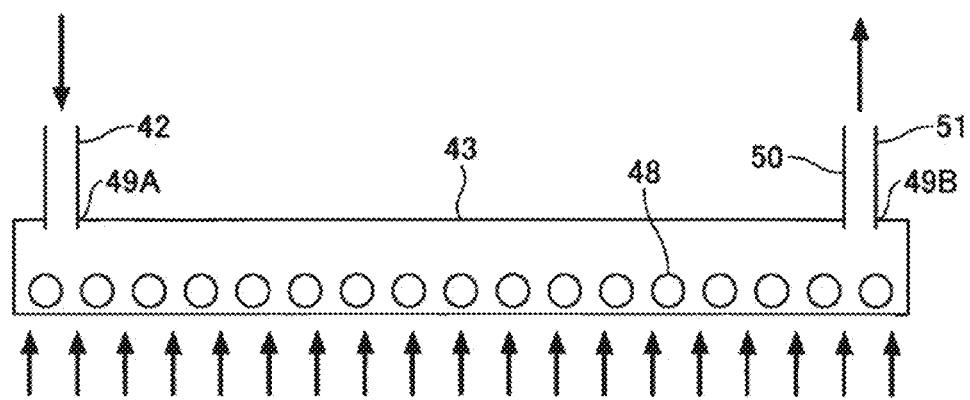
FIG. 2 is a view illustrating an example of an injector of the substrate processing apparatus according to the embodiment.

First, in the first embodiment, as illustrated in FIGS. 1 and 2, at least one end portion of the gas nozzle 43 communicates with the gas pipe 42 of the gas supply line 40, and the other end portion thereof communicates with the scavenging line 50. Furthermore, the gas discharge holes 48 of the gas nozzle 43 are formed as a plurality of gas holes which communicate with the interior of the reaction vessel 4 and constitute a supply port for supplying the process gas into the reaction vessel 4.

Openings 49 (openings 49A and 49B) are formed in both end portions of the gas nozzle 43. The opening 49A formed in one end portion constitutes an introduction port for introducing the process gas from the gas pipe 42 of the gas supply line 40 into the gas nozzle 43. Furthermore, the opening 49B formed in the other end portion constitutes a discharge port for discharging the scavenging gas to the gas pipe 51 of the scavenging line 50. That is, the gas nozzle 43 communicates with the gas supply line 40 via the opening 49A and communicates with the scavenging line 50 via the opening 49B.

In this configuration, the discharge port (opening 49B) for scavenging the process gas introduced into the gas nozzle 43 is installed in the gas nozzle 43 separately from the supply port (gas discharge holes 48) for supplying the process gas into the reaction vessel 4. The scavenging line 50 may be connected to the gas nozzle 43 via the corresponding discharge port. Therefore, a particle source causing particles (a byproduct adhered to the gas nozzle, delamination of a film formed in the gas nozzle, quartz pieces cracked in the gas nozzle due to stress of the delaminated film, or the like) can be scavenged from the gas nozzle 43 to the scavenging line 50.

In particular, even when a sudden process gas introduction occurs before the flow rate of the process gas supplied into the reaction vessel is stabilized, since the particle source can be scavenged from the gas nozzle 43 to the scavenging line 50, it is possible to suppress the particles from being brought into the reaction vessel 4.

Figure 3:
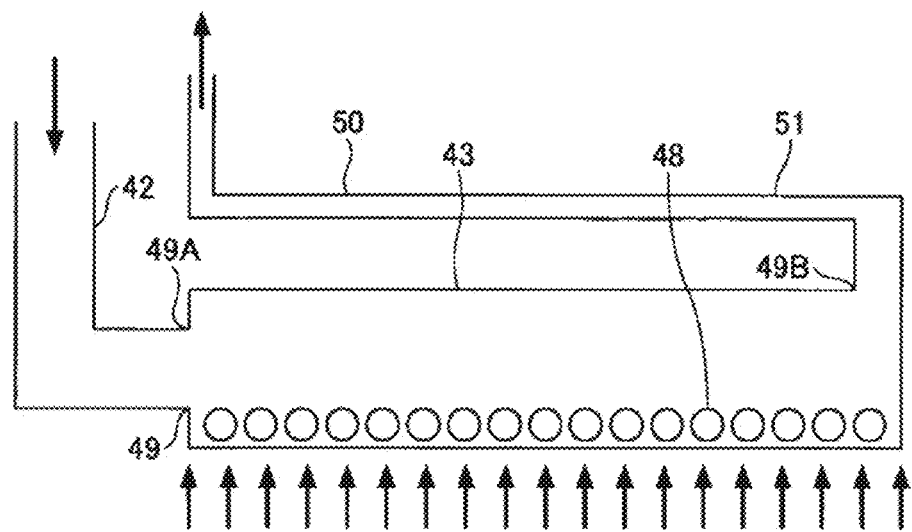
FIGS. 3 to 7 are views illustrating other examples of the injector of the substrate processing apparatus according to the embodiment.

In the second embodiment, as illustrated in FIGS. 1 and 3, in addition to the configuration of the first embodiment, the gas pipe 51 of the scavenging line 50 connected to the gas nozzle 43 is configured to extend near the opening 49A of the gas nozzle 43 (gas pipe 42 of the gas supply line 40). With this configuration, since the gas pipe 51 of the scavenging line 50 can be installed in the reaction vessel 4 (manifold 10) together with the gas pipe 42 of the gas supply line 40, the gas pipe 51 of the scavenging line 50 can be easily arranged.

Furthermore, in the second embodiment, as illustrated in FIG. 3, the gas pipe 42 of the gas supply line 40 is formed in an L shape near the opening 49A of the gas nozzle 43. That is, the gas pipe 42, while its end portion is bent, is connected to the opening 49A of the gas nozzle. With this configuration, the gas pipe 42 can be installed on the sidewall (manifold 10) of the reaction vessel 4 to facilitate the operation of arranging the gas supply line 40.

Figure 4:
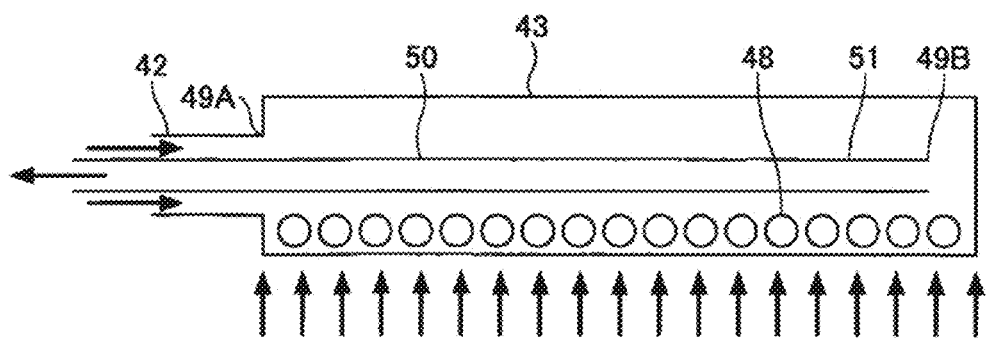

In the third embodiment, as illustrated in FIG. 4, a portion of the scavenging line 50 (gas pipe 51) is arranged inside the gas nozzle 43. That is, a portion of the gas pipe 51 of the scavenging line 50 and the gas nozzle 43 constitute a double tube. In the configuration of the third embodiment, a portion of the gas pipe 51 of the scavenging line 50 is also arranged inside the gas pipe 42 connected to the gas nozzle 43. With this configuration, since a portion of a space necessary for arranging the gas pipe 51 of the scavenging line 50 can be omitted, the scavenging line 50 can be compactly arranged.

Figure 5:
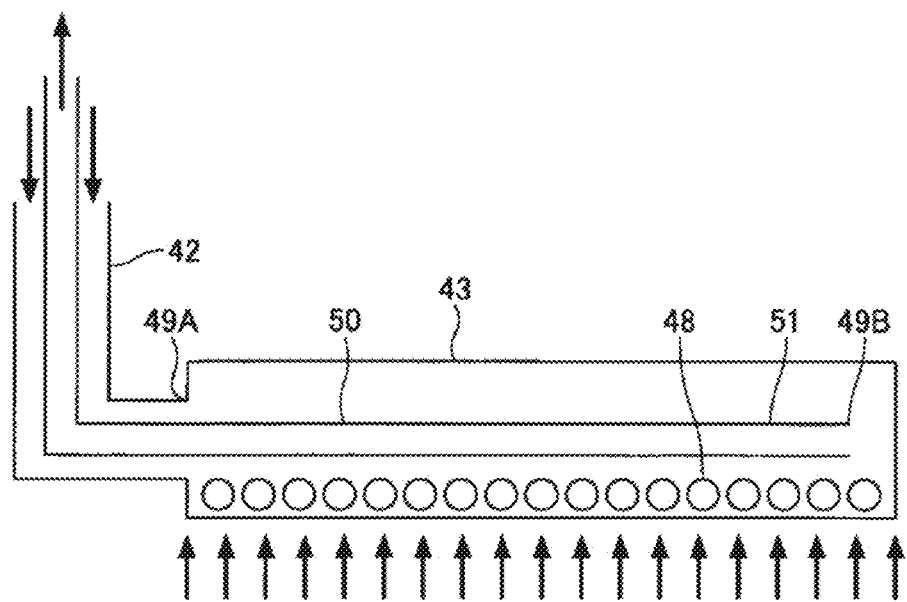

Furthermore, in the fourth embodiment, as illustrated in FIG. 5, in a state in which the configuration of the third embodiment is employed, a portion of the double tube constituted by a portion of the gas pipe 51 of the scavenging line 50 and the gas pipe 42 connected to the gas nozzle 43 is formed in an L shape. With this configuration, the scavenging line 50 can be further compactly installed.

Figure 6:
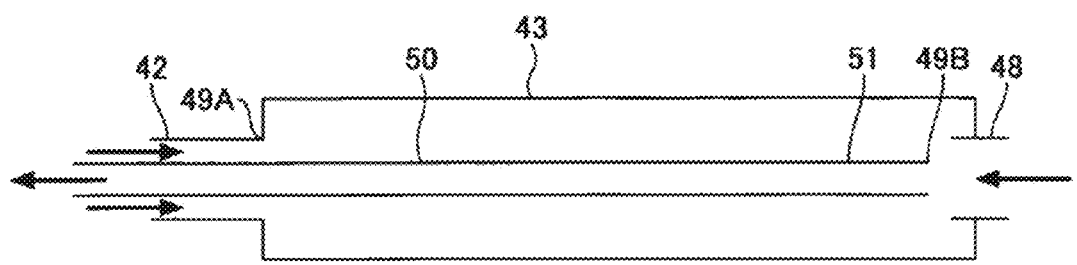

In the fifth embodiment, as illustrated in FIG. 6, one gas hole of the gas discharge hole 48 is formed. In this case, the gas nozzle 43 may be formed in at least one end portion of the gas nozzle 43 as a gas hole opened in the reaction vessel 4. In this manner, the scavenging line 50 can be installed irrespective of the number of gas holes.

In addition, in the configuration of the fifth embodiment, the gas discharge hole 48 is formed in the other end portion of the gas nozzle 43 (on the side of the opening 49B communicating with the scavenging line 50). In such a configuration, since the gas hole is arranged near the opening 49B (discharge port) communicating with the scavenging line 50, it is possible to efficiently scavenge the gas including the particle source near the gas hole.

Figure 7:
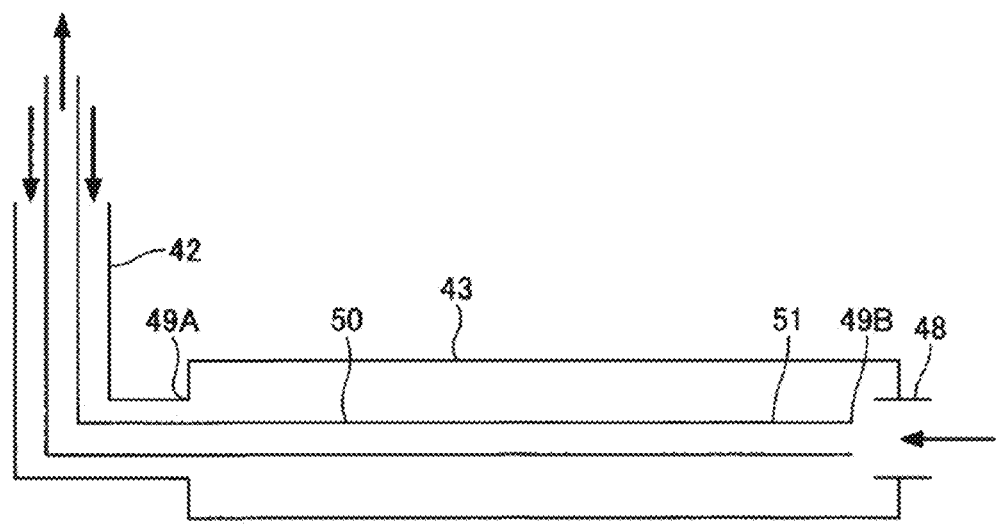

Furthermore, in the sixth embodiment, as illustrated in FIG. 7, in a state in which the configuration of the fifth embodiment is employed, a portion of the double tube constituted by a portion of the gas pipe 51 of the scavenging line 50 and the gas pipe 42 connected to the gas nozzle 43 is also formed in an L shape. With this configuration, it is possible to make the scavenging line 50 more compact.

Next, an example of a substrate processing method according to the present embodiment using the film forming apparatus 1 described above will be described. FIG. 8 is a flowchart illustrating an example of a substrate processing method according to the embodiment.

The substrate processing method according to the present embodiment includes at least a gas supply step and a scavenging step. In the gas supply step, a process gas is supplied from the gas nozzle 43 into the reaction vessel 4 that accommodates a plurality of wafers W.

The scavenging step is performed before the gas supply step. In the scavenging step, the interior of the gas nozzle 43 is scavenged. In the scavenging step, the internal pressure of the gas nozzle 43 is controlled to have a negative pressure.

The scavenging step is performed according to a process illustrated in FIG. 8. First, at ST1, it is determined whether or not a process of supplying a gas is a processing step performed first (first processing step). If it is determined that it is not the first processing step, the process proceeds to ST7 in which the gas supply step is executed and a normal gas supply process is performed.

If it is determined at ST1 that it is the first processing step, the process proceeds to ST2 in which the scavenging line 50 is opened. Specifically, at ST2, the opening/closing valve 52 of the scavenging line 50 is opened, and the interior of the gas nozzle 43 is allowed to have a negative pressure at ST3. In this case, the interior of the gas nozzle 43 communicating with the scavenging line 50 is depressurized by allowing the opening/closing valve 52 to operate in conjunction with the vacuum pump 73 of the exhaust line 70. The opening of the scavenging line 50 (ST2) and the depressurization of the interior of the gas nozzle 43 (ST3) may also be performed at the same time.

Subsequently, the process proceeds to ST4 in which the flow rate of the process gas is indicated to the flow rate controller (MFC) 45. The indicated flow rate of the gas can be adjusted to an appropriate flow rate at which the scavenging in the gas nozzle 43 is performed. The flow rate controller (MFC) 45 controls the opening/closing operations of the opening/closing valves 44 and 47 based on the indicated flow rate, and controls the flow rate of the process gas flowing through the gas supply line 40 to allow the process gas to flow through the gas supply line 40 (ST5).

Thereafter, the scavenging line 50 is closed. Specifically, the opening/closing valve 52 of the scavenging line 50 is closed (ST6).

When the processes of ST1 to ST6 described above are completed, the process proceeds to ST7 in which the gas supply step is executed and a normal gas supply process is performed. The control by the processes of ST1 to ST7 is performed by the controller 90 described above.

Furthermore, at the scavenging step, the internal pressure of the reaction vessel 4 is controlled to have a pressure higher than the internal pressure of the gas nozzle 43. That is, the opening/closing valve 52 of the scavenging line 50, and the pressure regulating valve 72 and the vacuum pump 73 of the exhaust line 70 are controlled so that the internal pressure of the gas nozzle 43 becomes lower than the internal pressure of the reaction vessel 4.

By this control, the process gas introduced into the gas nozzle 43 is not discharged into the reaction vessel 4 through the gas discharge hole 48 but flows directly to the scavenging line 50. Therefore, in the scavenging step, the scavenging gas that has passed through the gas supply line 40 is not discharged into the reaction vessel 4 but exhausted to the outside via the scavenging line 50.

In addition, by this control, the atmosphere of the reaction vessel 4 is sucked into the gas nozzle 43 through the gas discharge hole 48. Therefore, the particle source formed near the gas discharge hole 48 of the gas nozzle 43 and the particles floating in the reaction vessel 4 can be brought into the gas nozzle 43 through which the scavenging gas flows.

By implementing the substrate processing method in which such control is performed, even when a sudden gas introduction occurs, it is possible to suppress the particles from being brought into the process vessel.

Figure 9A:
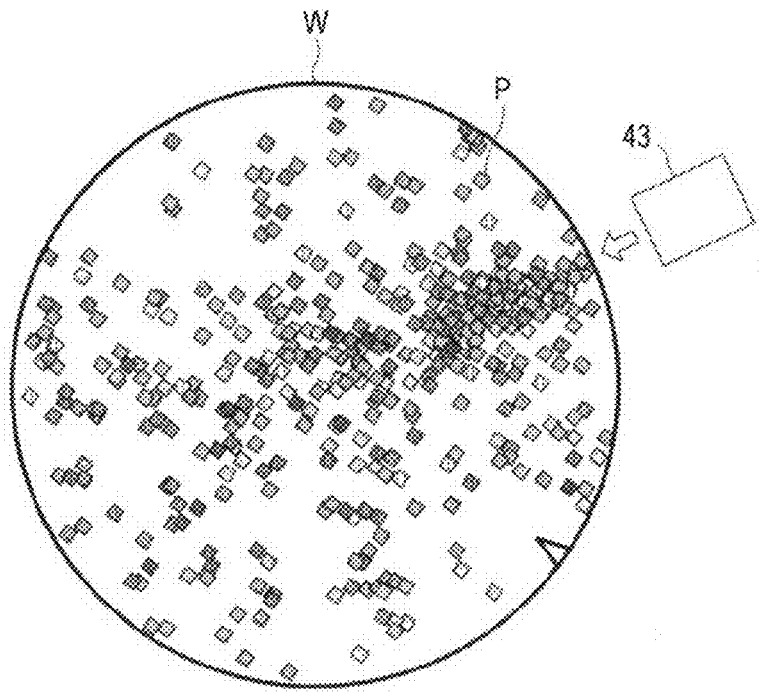
FIGS. 9A and 9B are diagrams illustrating a particle distribution on a substrate surface when a gas is supplied at a first processing step of an ALD process.
Figure 9B:
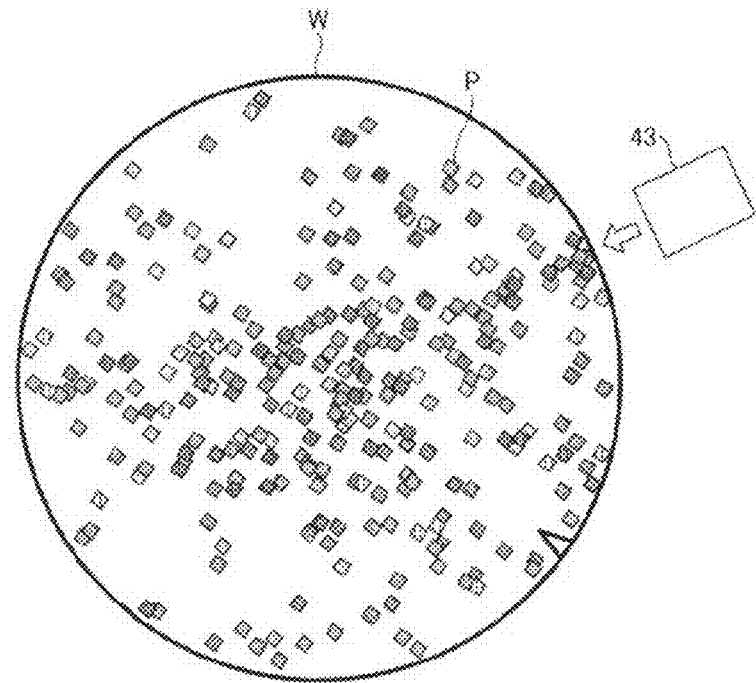

Next, effects of the substrate processing method according to the embodiment implemented using the substrate processing apparatus (second embodiment) of the present embodiment will be described. FIGS. 9A and 9B illustrate a particle distribution on a substrate surface when a gas is supplied from a gas nozzle of a substrate processing apparatus at a first processing step of an ALD process, respectively. FIG. 9A illustrates a particle distribution when a conventional substrate processing apparatus is used, and FIG. 9B illustrates a particle distribution when the substrate processing apparatus of the present embodiment is used.

First, when the conventional substrate processing apparatus of FIG. 9A is used, the amount of particles adhered to a surface of a wafer W is large. In addition, the particles adhered to the surface of the wafer W are adhered onto the wafer W while leaning toward the vicinity of the gas nozzle 43.

On the other hand, when the substrate processing apparatus of the present embodiment of FIG. 9B is used, the amount of particles adhered to the surface of the water W is smaller than when the conventional substrate processing apparatus is used. In addition, the particles adhered to the surface of the wafer W are substantially uniformly adhered onto the wafer W.

From these results, it can be seen that it is possible to prevent the particles from being brought into the reaction vessel 4 by installing the scavenging line 50 and performing the scavenging step and to suppress the particles from being adhered to the substrate, as in the present embodiment. Moreover, even when the particles were brought into the reaction vessel 4, it can also be seen that it is possible to prevent the particles from being unevenly adhered while leaning toward a portion of the surface of the water W.

By connecting the scavenging line 50 to the gas nozzle 43 via the discharge port (opening 49B) in this manner, the particle source causing the particles is scavenged from the gas nozzle 43 to the scavenging line 50, and it is possible to reduce the amount of particles being brought into the reaction vessel 4. Therefore, even when a sudden gas introduction occurs, it is possible to suppress the particles from being brought into the reaction vessel 4 and thereby prevent a reduction in productivity of the wafer W.

Furthermore, in this example, the kind of a gas to be used may be appropriately selected according to the type of film to be formed. In this example, there has been described a case where the ALD method is used as an example, but the present disclosure may also be applied to a case where a CVD method is used. That is, this example can be widely used for a film forming method used in an environment in which a sudden gas introduction occurs.

According to the present disclosure in sonic embodiments, it is possible to suppress particles from being brought into a process vessel even when a sudden gas introduction occurs.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a process vessel configured to accommodate a plurality of substrates;
    a gas supply part configured to supply a gas into the process vessel;
    an exhaust part configured to exhaust the gas in the process vessel; and
    a scavenging part configured to scavenge an interior of the gas supply part,
    wherein the gas supply part is connected to the scavenging part,
    wherein the scavenging part is connected to the exhaust part,
    and wherein the gas supply part includes an injector, the injector including a plurality of gas holes formed therein, the plurality of gas holes communicating with an interior of the process vessel.

2. The apparatus of claim 1, wherein the injector is configured to supply the gas into the process vessel, and
    at least one end portion of the injector is connected to the scavenging part.

3. The apparatus of claim 2, wherein a portion of the scavenging part is disposed inside the injector.

4. The apparatus of claim 2, wherein a gas hole communicating with an interior of the process vessel is formed in the at least one end portion of the injector.

5. A substrate processing method using the substrate processing apparatus of claim 1 to supply a gas from an injector into a process vessel configured to accommodate a plurality of substrates, comprising:
    scavenging an interior of the injector before the supplying a gas,
    wherein in the scavenging an interior of the injector, an internal pressure of the injector is controlled to have a negative pressure.

6. The method of claim 5, wherein in the scavenging an interior of the injector, an internal pressure of the process vessel is controlled to have a pressure higher than the internal pressure of the injector.

* * * * *